United States Patent [19]

Zarate

[11] Patent Number: 4,904,904
[45] Date of Patent: Feb. 27, 1990

[54] ELECTRONIC TRANSFORMER SYSTEM FOR POWERING GASEOUS DISCHARGE LAMPS

[75] Inventor: Humberto T. Zarate, Houston, Tex.

[73] Assignee: Lumintech, Inc., Houston, Tex.

[21] Appl. No.: 199,313

[22] Filed: May 26, 1988

Related U.S. Application Data

[63] Continuation of Ser. No. 118,793, Nov. 9, 1987, abandoned.

[51] Int. Cl.$^4$ .................. H05B 37/02; H05B 41/36
[52] U.S. Cl. ........................ 315/219; 315/DIG. 5; 315/DIG. 7
[58] Field of Search ............. 315/177, 209 R, 219, 315/225, DIG. 5, DIG. 7

[56] References Cited

U.S. PATENT DOCUMENTS

| | | | |
|---|---|---|---|
| 3,922,582 | 11/1975 | Pitel | 315/106 |
| 4,109,307 | 8/1978 | Knoll | 363/101 |
| 4,318,170 | 3/1982 | Cabalfin | 363/133 |
| 4,417,181 | 11/1983 | Leale | 315/209 R |
| 4,424,468 | 1/1984 | Zelina et al. | 315/222 |
| 4,459,516 | 7/1984 | Zelina et al. | 315/209 R |
| 4,463,286 | 7/1984 | Justice | 315/219 |
| 4,472,661 | 9/1984 | Culver | 315/219 |
| 4,532,456 | 7/1985 | Knoll et al. | 315/223 |
| 4,553,070 | 11/1985 | Sairanen et al. | 315/209 R |
| 4,572,990 | 2/1986 | Leale et al. | 315/220 |
| 4,588,924 | 5/1986 | Luursema et al. | 315/107 |
| 4,603,378 | 7/1986 | Virta | 363/56 |
| 4,613,934 | 9/1986 | Pacholok | 363/131 |
| 4,633,141 | 12/1986 | Weber | 315/307 |
| 4,667,131 | 5/1987 | Nilssen | 315/275 |
| 4,667,132 | 5/1987 | Leale | 315/282 |
| 4,682,082 | 7/1987 | MacAskill et al. | 315/219 |
| 4,692,667 | 9/1987 | Nilssen | 315/209 R |
| 4,700,112 | 10/1987 | Chang | 315/205 |

FOREIGN PATENT DOCUMENTS

| | | |
|---|---|---|
| 8300271 | 1/1983 | PCT Int'l Appl. |
| 1515618 | 6/1978 | United Kingdom . |
| 2070350 | 9/1981 | United Kingdom . |
| 2102638 | 2/1983 | United Kingdom . |
| 2163014 | 2/1986 | United Kingdom . |

Primary Examiner—David Mis
Attorney, Agent, or Firm—Litman, McMahon & Brown

[57] ABSTRACT

An electronic transformer system for powering gaseous discharge lamps includes an output transformer having a load connected to a secondary winding and having a power storage capacitor connected in series with a primary winding, a charging transistor connecting one end of the series combination to one polarity terminal of a voltage doubler DC power source, the other end of the series combination connected to the other polarity terminal of the power source, a discharging transistor connected across the series connected primary and capacitor, and an oscillator connected through a coupling transformer to the bases of the transistors. The oscillators alternately causes the transistors to switch into conduction to thereby alternately cause the charging and discharging of the capacitor through the output transformer. The charging and discharging characteristics of the capacitor result in the turn off of the transistors occurring at low current levels whereby turn off of the transistors is accelerated.

18 Claims, 2 Drawing Sheets

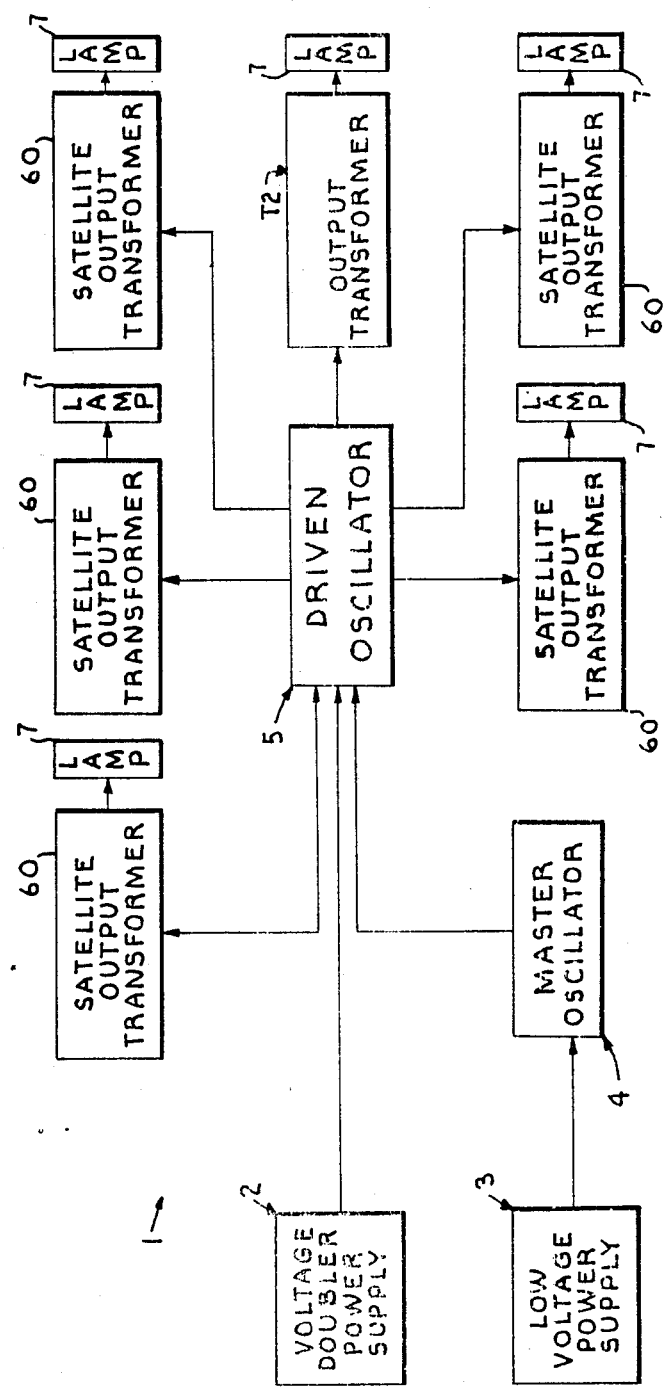

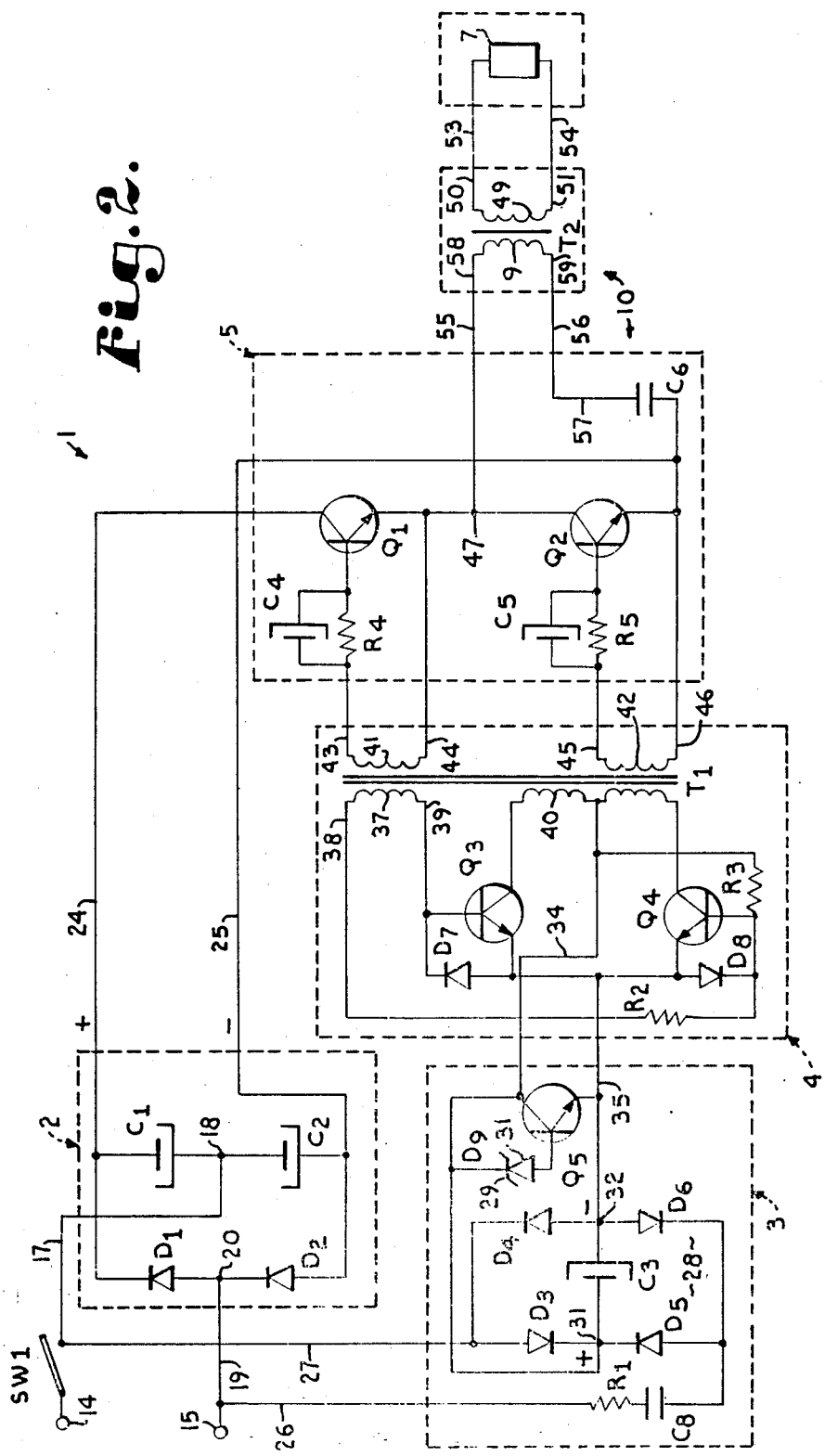

ELECTRONIC TRANSFORMER SYSTEM FOR POWERING GASEOUS DISCHARGE LAMPS

CROSS-REFERENCE TO RELATED APPLICATION

This is a continuation of application, Ser. No. 118,793, filed Nov. 9, 1987 for ELECTRONIC TRANSFORMER SYSTEM FOR POWERING GASEOUS DISCHARGE LAMPS, now abandoned.

FIELD OF THE INVENTION

The present invention relates to high voltage power supplies for gaseous discharge lamps and, more particularly, to such a power supply which exploits decaying current level late in the charging/discharging cycle of a capacitor to speed the turn off of transistors switching the charging/discharging current to the capacitor.

BACKGROUND OF THE INVENTION

One of the principal problems of power supplies for gaseous discharge lamps is heat produced in the semiconductors and other related components, for example transformer windings. Many different configurations are known for use in power oscillators and converters to achieve better efficiency and less heat dissipation. There are advantages and disadvantages to some of the most widely used configurations.

The most widely used configuration is two transistors in a push-pull arrangement oscillating in counter phase. This configuration presents the problem that with a 120 VAC supply and a full wave bridge rectifier, the filtered DC will be 170 volts, and the collector to emitter voltage of the transistor in the off condition goes up to 340 VDC. This requires a transistor with an $E_{CBO}$ of 340 VDC plus 20% for a safety factor, totaling 408 VDC. A transistor with this parameter and high current and gain will be relatively expensive.

Electronic designers, in trying to achieve a more economical configuration, have produced full and half bridge converters. The full bridge configuration uses four transistors connected in series, two by two across the full voltage of the power supply, with the primary of the transformer connected across the common emitter-collector point of each of the two series transistors. Using the voltage of the push-pull configuration described above as a comparison, the total reverse voltage $E_{CBO}$ across the transistors is now 170 VDC, which is the voltage of the power supply. The transistors divide the power supply voltage, and the potential applied to the primary winding is now half of the source voltage. However, there is a drawback. The collector current needs to be doubled in order to transmit the same power, and four transistors are required to implement the circuit with a correspondingly more complicated base polarization network.

One circuit that is very popular is derived from the full bridge. Electronic engineers looking for simpler design developed the half bridge. Two of the transistors are replaced by two capacitors, forming a capacitive voltage divider. The only advantage of this configuration is the saving of two power transistors. Neither the full nor the half bridge is a self starting oscillator. Both need to be driven by special circuitry which is electrically isolated, and the higher currents demanded by the powered circuits pose an additional stress to the power transistors.

Another very popular configuration, due to its simplicity, is the one transistor blocking oscillator used extensively in flyback circuits. Its major disadvantage is the limitation of power handling capability, on the order of 50 watts. Higher powers are possible, but the circuit becomes too complicated, and the initial simplicity is lost.

Finally, complementary symmetry is sometimes employed in such power supply circuits. The implementation of complementary symmetry requires a pair of matched PNP-NPN transistors, which is one of the causes of its lack of popularity.

One of the major problems encountered in solid state power converters is long transistor turn off time. Bipolar transistors have a minority carrier stored base charge, and this makes them slower. The common base capacitance establishes their switching characteristics. This makes their storage time longer, and a large collector current is difficult to cut off in a short time. When the collector current is controlled by the inductance of the primary, as is the case in all the configurations cited above, at the end of the conduction time, the inductance value is smaller than at the beginning. Even in driven transformers where the operating B value (magnetic flux density) of the core is chosen far away from saturation, the inductive reactance is much smaller at the end than in the beginning of the conduction time. This inherent fact makes the current density heavier at the end of the cycle and more difficult to turn off. The storage time of the transistor, at this particular moment, becomes longer and the transistors start to have simultaneous conduction at the mutual turn off/turn on time. The delay in turn off can be as long as two microseconds. Particularly at this moment when the two transistors conduct simultaneously, the value of the inductance drops to zero and a very short transient of high collector current is produced. The ohmic resistance of the related circuits limits the current. This situation worsens when there is a high collector current just before the turn off time. This causes overheating of the transistor junction and its eventual destruction.

There are electronic tricks to speed up the turn off time of power transistors. They are implemented by extensive use of capacitor, diode, and resistor combinations all of kinds. The problem is so serious that the major semiconductor companies developed various kinds of pulse width modulator (PWM) circuits for specific application in switching power supplies.

The maximum current through an inductance occurs at the end of five time constant periods. At this time, the current will be the maximum allowed by the circuit. In contrast to this, when a capacitor charges or discharges, at the end of the five time constant periods, the current will be virtually zero. The capacitor current before the fifth time constant will always be smaller than the current at the beginning of the conduction time. If the frequency and the value of the capacitor are selected in such a way that the conduction time is longer than one time constant period, the current at the end of the conduction time will be less than 36.8% of the initial value. The use of this particularity will ease the turn off of a power transistor. If two constant times are achieved, the value of the current will be 13.5% of the initial value.

SUMMARY OF THE INVENTION

The present invention relates to an electronic transformer system for powering gaseous discharge lamps and including a plurality of capacitors, diodes, resistors, transistors, a driver transformer and a driven transformer, and may include one or a plurality satellite driven transformers in remote locations. The improvement comprises a driven oscillator or switching means for exploiting the decaying action of an exponential charge/discharge capacitive current generated by at least one of the capacitors to control the primary current of the driven transformer. A full wave rectifier voltage doubler supply steps up and converts AC input voltage into a higher filtered DC voltage in order to lower the primary current of the driven transformer. One or a plurality of satellite driven transformers in remote locations share the power generated by one electronic transformer system for gaseous discharge lamps.

The present invention uses a unique configuration of two power transistors and one charge/discharge or power storage capacitor to produce an exponential high frequency AC current. The two transistors are driven by a self starting, low power push-pull master oscillator through a coupling transformer with a saturated core. The master oscillator has its own low voltage transformerless power supply. The base polarization network of the master oscillator has been designed in order to have a very low parts count. Timed on/off signals from the master oscillator are magnetically coupled to the base polarization network of the two power transistors. This provides suitable electrical isolation between the two power supplies whose negative terminals are not at the same potential and facilitates the polarization of the two transistors.

The isolating coupling driver transformer is wound in such a way that the two secondary voltages are in agreement with the maximum parameters of direct and reverse base-emitter voltages of the two power transistors. Two speed-up base capacitors will present at the turn-off time a negative potential of the same absolute value as the positive direct base bias. This negative sweeping effect will be more effective due to the decaying exponential capacitive current object of the present invention. The two power transistors are connected in series across the voltage doubler power supply. The charge/discharge capacitor or power storage capacitor is connected in series with the primary winding of the output transformer. The series combination of primary-capacitor is alternately connected in parallel with each of the power transistors by the switching action of the transistors. The parallel connection can be made from the common emitter-collector point between the two power transistors to either the positive or the negative side of the voltage doubler power supply. The performance of the circuit is not affected by the order of the primary and capacitor between the common transistor connection point and the power supply or by the polarity of the power supply terminal to which the series combination of the primary and capacitor is connected.

The unique configuration of this invention exploits the characteristic decaying action of the charge/discharge capacitive current. This puts both transistors in an ideal low conduction state at the end of each cycle. This is in complete contrast to all other configurations in which the current is controlled by the inductive reactance of the primary transformer. It is well known that the inductive current of an inductor reaches 63.8% of the maximum value allowed for the external circuit in the first time constant period. This places the transistor exactly at cut off time in a higher conduction state than at the beginning of the cycle. Transistors with heavy collector currents have longer cut off times. In a push-pull configuration, this causes simultaneous conduction in the transistors and limitations in the ability to transfer power.

In the present invention the more charged or discharged the charge/discharge capacitor is at the end of the first cycle, the lower will be the collector current that the transistor must turn off. The lower the collector current, the faster the transistor will go out of conduction. It is the principal objective of the present invention to have a much lower collector current at the end of each conduction cycle than at the beginning and, as a consequence, to have much shorter turn off time.

The exponential current from the two transistors is fed to the primary of the power transformer which delivers the proper voltage and current to drive the lamp. Because of the unique configuration of the two power transistors and the capacitor, the primary transformer needs only one primary winding and only two connections to it. This permits the installation in a remote location of a power transformer with only two wires and makes possible the installation of several satellite power transformers sharing the primary capacitive exponential current. In the event of satellite installations, the capacitor must be sized in order to provide the overall capacitive current demanded by the various satellite transformers.

The self-regulated current power transformer utilizes a low loss ferrite U-shaped core with the primary and the secondary wound on opposite legs. This provides the loose coupling needed in order to regulate the secondary current under conditions of load variation. The primary current will go up or down according to the power delivered to the load or loads. The secondary of the power transformer is wound in a separate bobbin.

The DC power supply utilizes a full wave rectifier doubler to provide a steady 300 VDC from the 120 VAC power line in order to achieve a lower collector current for a given power requirement. The 300 VDC input voltage will lower the capacitive collector current by a factor of 1.83, compared to a 170 VDC supply, and reduce the heat caused by Joule effect in the transistors by a factor of 3.35. If 220 VAC is applied to an appropriate full wave rectifier voltage doubler supply, the output voltage will be approximately 550 VDC. With this supply voltage, the overall differences in less current and heat production with respect to an input voltage of 170 VDC are 3.24 and 10.47 respectively. There are plenty of high voltage low current transistors which are commercially available.

The present invention achieves a lower collector current at the end of the transistor conduction time by the following means:

(1) The full wave voltage doubler supply of the present invention delivers 300 VDC. Compared to a half bridge configuration with a supply voltage of 170 VDC and 85 VDC across each transistor, the collector current in the transistors of the present invention is lowered by a factor of 3.52 (300/85). In comparison to a push-pull configuration with 170 VDC across the transistor in conduction, the collector current of the transistors of the present invention is lowered by a factor of 1.76 (300/170).

(2) The heat dissipation by Joule effect in a transistor is a quadratic inverse relationship of the current. In the present invention, the heat produced is reduced by a factor of 12.39 (3.52×3.52).

(3) It is known that the temperature raises the beta, or current gain, of a transistor, creating the risk of an avalanche effect. A cooler junction keeps the collector current under control and makes the turn off faster.

(4) Using a capacitor as a current source for more than two time constant periods, it is assured that the current will be at very low levels at the end of the conduction time. This makes the combination of a speed up capacitor/resistor network in the base circuits of the power transistors work more efficiently, turning the power transistors off very fast.

The basis of the present invention is the charge/discharge capacitor. Determining the required capacitance for a given load is important for practicing the present invention. Below are steps which may be used to determine the capacitance value required to power a load, such as a neon sign:

(A) Determine the voltage required to illuminate the length of tubing of the neon lamp, according to well known relationships.

(B) The current flowing in the lamp for the selected voltage is an established industry standard, and the load that it presents to the output transformer is resistive and is determined by its reflected impedance $Z_s$ according to Ohm's Law.

(C) The primary voltage is set by the AC power line voltage and the configuration of power supply employed, in the present invention a full wave rectifier voltage doubler supply.

(D) Determine the impedance of the primary winding $Z_p$ by the relationship:

$$Z_p = (E_p/E_s)^2 * Z_s$$

(E) Determine the inductance of the primary that will result in $Z_s$ at the selected operating frequency by the relationship:

$$L_p = Z_p/\text{omega} \quad (\text{omega} = 2*\text{pi}*\text{freq})$$

(F) With the parameters supplied by the manufacturer of the core of the transformer, determine the number of turns for the primary ($N_p$) that will result in $L_p$.

(G) Determine the number of turns $N_s$ of the secondary by:

$$N_s = (E_s/E_p)*N_p$$

(H) Approximate the value of the primary capacitive current $I_c$ by:

$$I_c = (E_s/E_p)*I_s$$

(I) Approximate the value of the capacitor by:

$$C = I_c/(dE_c/dt)$$

where:
dE$_c$=variation of the capacitor voltage
dt=length of time during which dE$_c$ occurs (J) This calculation can be verified by the following expression for the value of current in a discharging capacitor:

$$i_c = I(e^{-t/RC})$$

(K) Double check with:

$$t = 2.3*RC*\log(I/i_c)$$

where:
$i_c$=instantaneous current in the capacitor at time t
R=overall outside resistance encountered by $i_c$
e=natural logarithm base (2.7182)
log=logarithm base 10
I=maximum current in the circuit after the transient The following variations are intended to be covered by the present invention: the use of a rectifier voltage doubler at higher voltages than 120 VAC; the use of a different configuration for the master drive oscillator; the use of a half wave voltage doubler; the use of a bridge rectifier without a voltage doubler; the use of FET's (field effect transistors) instead of bipolar devices as shown in the preferred embodiment; and the use of alternative speed up devices for the base circuits of the power transistors including other types of resistor-capacitor networks and fast recovery diodes.

OBJECTS OF THE INVENTION

The principal objects of the invention are: to provide an improved power supply system for powering gaseous discharge lamps; to provide such a system which overcomes some of the problems posed to the electronic engineer in designing more efficient solid state power transformer systems for such lamps; to provide such a system which incorporates a voltage doubler power supply to lower the current through power switching transistors employed therein and, as a result, to lower the heat dissipation of the transistors; to provide such a system generally including a master oscillator powered by its own low voltage power supply which is isolated from the voltage doubler power supply, a driven oscillator coupled to the master oscillator by a coupling transformer, and a charge/discharge or power storage capacitor connected in series with the primary winding of an output transformer having a gaseous discharge lamp connected to a secondary thereof; to provide such a system wherein the driven oscillator includes a pair of power switching transistors which are alternately switched into conduction by trigger signals from the master oscillator to cause charging and discharging of the capacitor; to provide such a system which exploits the inherent low current level late in the charge/discharge cycle of the capacitor such that turn off of the conducting transistor is facilitated; to provide such a system which incorporates RC elements in the base bias circuits of the power switching transistors to accelerate the turn on and turn off of the transistors; to provide such a system wherein the primary of the output transformer is connected by only two wires to facilitate the connection of a plurality of satellite transformers with loads to the system; to provide such a system which is adaptable to power a great variety of types of gaseous discharge lamps; and to provide such a system which is economical to manufacture, efficient in operation, and which is particularly well adapted for its intended purpose.

Other objects and advantages of this invention will become apparent from the following description taken in conjunction with the accompanying drawings wherein are set forth, by way of illustration and example, certain embodiments of this invention.

The drawings constitute a part of this specification and include exemplary embodiments of the present invention and illustrate various objects and features thereof.

BRIEF DESCRIPTION OF THE DRAWINGS

FIG. 1 is a block diagram of the principal components of an electronic transformer system according to the present invention.

FIG. 2 is a schematic diagram of the transformer system adapted for use with neon lamps.

DETAILED DESCRIPTION OF THE INVENTION

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Referring to the drawings in more detail:

The reference numeral 1 generally designates an electronic transformer system for powering gaseous discharge lamps embodying the present invention. The system 1 includes a voltage doubler power supply 2, a low voltage power supply 3, a master or trigger oscillator 4 powered by the low voltage supply 3, and a driven oscillator or power switch 5 which is caused by the master oscillator 4 to switch power from the voltage doubler supply 2 to at least one output transformer T2 having a gaseous discharge lamp 7 connected thereto.

Referring to FIG. 2, the power switch 5 includes a power storage capacitor C6 which is connected in series with a primary winding 9 of the transformer T2 to form a series combination 10 thereof. In general, the power switch 5 causes the capacitor C6 to cyclically charge and discharge through the primary winding 9. Because of the charging and discharging characteristics of the capacitor C6, the current levels late in the charge and discharge cycles are low which facilitates the turn off of switching devices or transistors Q1 and Q2 in the driven oscillator 5.

Referring particularly to FIG. 2, terminals 14 and 15 connect to an AC power source (not shown), such as a conventional 120 VAC power line. An on/off switch SW1 connects between one of the AC terminals, such as terminal 14, and the voltage doubler supply 3. A conductor 17 connects SW1 and AC terminal 14 to series connected capacitors C1 and C2 at a midpoint 18 therebetween. Capacitors C1 and C2 are illustrated as electrolytic capacitors. A conductor 19 connects AC terminal 15 to a midpoint 20 between a pair of series connected diodes D1 and D2. When SW1 is closed, AC power is applied to points 18 and 20.

By action of the reverse blocking of diodes D1 and D2, capacitor C1 is charged in the first half cycle to the peak positive voltage of the input AC and capacitor C2 is charged in the second half cycle to the peak negative voltage of the input AC. Both voltages are referred to point 18. As a consequence of this action, the combined voltages across capacitors C1 and C2 are available on conductors 24 and 25, which are respectively the positive and negative output terminals of the supply 2. The voltage is full wave rectified and double the peak voltage of the AC input power. The value of capacitors C1 and C2 is calculated in order to be able to supply the current needed with an acceptable ripple.

Conductors 26 and 27 supply AC power to the transformerless, low power, low voltage, regulated power supply 3 through a resistor R8 and capacitor C8 in conductor 26. The value of capacitor C8 is calculated according to the root mean square (rms) AC supply voltage and the current needed to drive the base of transistors in the driver oscillator. Resistor R1 limits inrush current to safe levels. Diodes D3, D4, D5 and D6 form a full wave bridge rectifier 28, and capacitor C3 is a filter capacitor for the low voltage power supply 3.

The cathode 29 of a Zener diode D9 is connected to the positive output 30 of the bridge rectifier 28. An anode 31 of diode D9 is connected to the base of a transistor Q5. The collector-emitter path of transistor Q5 is connected between the positive output 30 of the supply 3 and a negative output 32 thereof. Q5 is a high gain transistor with a typical $h_{fe}$ over 100. Q5 acts as a Zener multiplier having its collector current $h_{fe}$ times greater than its base current through the Zener diode D9. The combination of Zener diode D9 and transistor Q5 regulates the voltage of the power supply 3 and eliminates the need for a high wattage costly Zener diode.

In the master oscillator 4, a conductor 34 from the positive terminal 30 of the supply 3 supplies a positive voltage to a center tapped primary winding of a driver transformer T1. A conductor 35 from the negative terminal 32 of supply 3 supplies the negative voltage to the emitters of Q3 and Q4. When SW1 is closed, resistor R3 presents a direct bias to the base of Q4 which starts conducting. With the correct phasing of a feedback winding 37, a positive potential is present at a point 38, and a negative swing is present at a point 39 on the opposite end of the winding 37. Resistor R2 supplies the base current to Q4 and drives it into full conduction. When the core of T1 reaches saturation, the voltage at point 38 of feedback winding 37 is reduced, and the direct bias is present on base of Q3. Q3 starts conducting, and this reverses the magnetic field in the windings of T1. The phasing of winding 37 cuts off Q4, and Q3 goes into full conduction.

When the core of T1 reaches saturation, the voltage at point 39 reduces, turning off Q3, and Q4 receives forward bias and starts conducting. Resistor R2 supplies the proper base current to Q3. This alternating conduction is repeated for as long as the power is present on conductors 34 and 35 from the power supply 3. This repeated action maintains the oscillations of the master oscillator 4. Because of this particular configuration, the base current for both transistors circulates through R2. Fast recovery type diodes D7 and D8 protect the bases of both transistors from an excessive negative swing. With proper calculation of the turns ratio of feedback winding 37 with respect to the primary winding 40 of T1, diodes D7 and D8 can be eliminated without loss of performance. The frequency of the master oscillator 4 is determined by a trade off between the electrical parameters of Q3 and Q4 and the magnetic properties of the core used in transformer T1.

Secondary windings 41 and 42 supply a perfect square wave voltage signal to the inputs of the driven oscillator 5. In the driven oscillator 5, signals from secondary windings 41 and 42 are applied 180 electrical degrees out of phase to input points 43–44 and 45–46 respectively of windings 41 and 42. As depicted in FIG. 2, transistors Q1 and Q2 are connected in series across the terminals 24 and 25 of the voltage doubler power supply 2. Charge/discharge or power storage capacitor C6 is connected to the negative conductor 25 and through the primary winding 9 of T2 to the junction of the emitter of Q1 and collector of Q2 at a point 47.

When point 43 of secondary winding 41 is at a relatively high voltage, point 46 of winding 42 is also high, and points 44 and 45 are low. When point 43 is at a low voltage, point 46 is low, and points 44 and 45 are high. This phasing of windings 41 and 42 turns Q1 and Q2 on and off at the same frequency as the master oscillator 4. The combinations of C4-R4 and C5-R5 work as signal conditioners for Q1 and Q2, speeding up their turning on and off times. When point 43 is more positive than point 47, C4 starts charging very fast through the emitter-base junction of Q1. This high transient charging current of C4 speeds up the turn on time of Q1. When this transient current starts to decay, Q1 sustains its conduction with the steady current through R4. C4 charges to the voltage between points 43–44 minus the emitter-base voltage drop of Q1.

The fast turn on of Q1 by the action of C4 presents an instantaneous low impedance path to charge C6 through the primary winding 9 of T2. This high starting exponential charging current of C4 speeds up the turn on time of Q1. When this transient exponential current starts to decay, Q1 sustains its conduction state with the steady current through R4. By the turns ratio of T2, this exponential charging current and voltage of C6 will be transformed and available at a secondary winding 49 at points 50 and 51. Conductors 53 and 54 from points 50 and 51 respectively connect the neon lamp 7 to T2.

As transistor Q1 conducts on the first half cycle, Q2 is kept off conduction by the action of the phasing of winding 42 as explained above. When the first half cycle is timing off, the exponential charging current of C6 is decaying to a very low level according to the RC time constant of the discharging circuit, where R is the compounded impedance of the charging circuitry. At the end of the first half cycle, the voltage across charge/discharge capacitor C6 will be the voltage of the output of the voltage doubler power supply 2, minus the voltage drop of Q1 and the voltage of the primary winding 9 of T2. With a proper calculation of C6 this voltage drop will be negligible.

During the first half cycle, transistor Q2 is kept off conduction by the phasing action of windings 41 and 42. When the first half cycle times off, point 43 of winding 41 goes low and point 44 goes high. This sudden drop in voltage at point 43 causes the stored charge of C4 to instantaneously start discharging through R4, polarizing the base of Q1 respect to its emitter with a negative voltage equal to the charged voltage of C4. At the start of the discharge of C4, transistor Q1 is in a weaker conduction state due to the decaying exponential charging current of C6. The negative voltage from C4 sweeps the base of Q1 and shortens its cut off time considerably. Capacitor C6 at the cut off time of Q1 has completed or is near completion of its charge. Its voltage is the voltage of the power supply 2 or very near to it. With 120 VAC input power to the voltage doubler power sypply 2, point 47 is 300 VDC more positive than point 46.

At the same time that capacitor C6 completes its charging, the second half cycle starts. Winding 42 of T1 presents a positive bias on base of Q2. The combination of C5-R5 performs exactly the same functions as C4-R4. When point 45 of winding 42 of T1 is more positive than point 46, C5 presents a path of very low impedance to the emitter-base current of Q2. This causes C5 to start charging very fast to the voltage across winding 42 minus the voltage drop of the emitter-base junction of Q2. This high starting exponential charging current of C5 speeds up the turn on time of Q2. When this transient exponential current starts to decay, Q2 sustains its conduction state with the steady current through R5. The fast turn on time of Q2 by the action of C5 presents an instantaneous low impedance path for charge/discharge capacitor C6 to discharge through Q2 and the primary winding 9 of T2. By the turns ratio of T2, this exponential discharging current and voltage of C6 will be transformed and available at points 50 and 51 of secondary winding 49.

As transistor Q2 conducts on the second half cycle, Q1 is kept off conduction by the action of the phasing of winding 41. When the second half cycle is timing off, the exponential discharging current of C6 is decaying to a very low level according to the RC time constant of the discharging circuit. At the end of the second half cycle, the voltage across charge/discharge capacitor C6 will be its remaining voltage plus the voltage drop of Q2. With a proper calculation of C6 this remaining voltage will be negligible.

During the second half cycle, transistor Q1 is kept off conduction by the phasing action of windings 41 and 42. When the second half cycle times off, point 45 of winding 42 goes low and point 46 goes high. This sudden drop in voltage at point 45 causes the stored charge of C5 to instantaneously start discharging through R5, polarizing the base of Q2 respect to its emitter with a negative voltage equal to the charged voltage of C5. At the start of the discharge of C5, transistor Q2 is in a weaker conduction state due to the decaying exponential discharging current of C6. This negative voltage from C5 sweeps the base of Q2 and shortens its cut off time considerably when it goes off. As explained above, when Q2 goes off, capacitor C6 has completed or is near completion of its discharge, and the voltage across C6 is the voltage drop across Q2 or its remaining voltage.

Conductors 55 and 56 from points 47 and 57 respectively of the driven oscillator 5 are connected to points 58 and 59 of primary winding 9 of T2. The unique configuration of the present invention of having only two conductors between the driven oscillator 5 and the output transformer T2 makes it possible to connect several satellite transformers 60 (FIG. 1) at remote locations to output points 47 and 57. This special feature of the present invention permits the connection of each satellite unit with only two wires. In a multiple satellite installation, C6 must be sized to supply the overall exponential current demanded by all the satellite transformers 60.

Two prototypes of the system 1 have been built with power capacities of 100 and 200 Watts to power a neon sign and two 8 foot long, high output fluorescent lamps. The units operated at a high efficiency of over 89%, and very low amounts of heat were produced in the transistors with an aluminum heat sinking surface of only 9 square inches by 0.40 inch thickness.

It is to be understood that while certain forms of the present invention have been illustrated and described herein, it is not to be limited to the specific forms or arrangement of parts described and shown.

What is claimed and desired to be secured by Letters Patent is as follows:

1. A power supply circuit for powering a load from a direct current power source and comprising:
   (a) an output transformer having a primary winding and a secondary winding;

(b) a power storage capacitor connected in series with said primary winding to form a series combination;

(c) controlled power switch means connected across said series combination and for connecting said series combination across said power source; and (d) trigger means independent of said series combination, said trigger means being connected to and cooperating with said controlled power switch means to alternately cause charging current to flow through said primary winding to said capacitor from a direct current power source and discharging current to flow through said primary winding from said capacitor.

2. A circuit as set forth in claim 1 wherein:
(a) said trigger means includes an oscillator operating at a selected frequency.

3. A circuit as set forth in claim 1 wherein said output transformer is a first output transformer including a first primary winding and a first secondary winding having a first load connected thereacross, and including:
(a) a second output transformer having a second primary winding connected in parallel with said first primary winding and having a second load connected to a second secondary winding of said second output transformer.

4. A circuit as set forth in claim 1 including:
(a) a direct current power source which is a voltage doubler power converter to convert alternating current to direct current at substantially double the peak voltage of said alternating current.

5. A circuit as set forth in claim 1 including:
(a) a gaseous discharge lamp connected to said secondary winding as a load.

6. A power supply circuit comprising:
(a) a direct current power source having a pair of opposite polarity power terminals;
(b) an output transformer having a primary winding and a secondary winding;
(c) a power storage capacitor connected in series with said primary winding to form a series combination having a pair of opposite ends, one of said ends being connected to one of said power terminals;
(d) a charging controlled power switch connecting another of said ends of said series combination to another of said power terminals;
(e) a discharging controlled power switch connected across said series combination; and
(f) trigger means independent of said series combination, said trigger means being connected to said charging and discharging controlled power switches and alternately activating one of said power switches to close circuit and substantially simultaneously deactivating the other of said power switches to open circuit to thereby cause charging current to flow through said primary winding to said capacitor from said power source when said charging power switch is close circuited and to cause discharging current to flow through said primary winding from said capacitor when said discharging power switch is close circuited.

7. A circuit as set forth in claim 6 wherein:
(a) said trigger means includes an oscillator operating at a selected frequency.

8. A circuit as set forth in claim 6 wherein said trigger means includes:
(a) an oscillator operating at a selected frequency; and (b) said oscillator is coupled to said power switches by a coupling transformer.

9. A circuit as set forth in claim 6 wherein said trigger means includes:
(a) a driver transformer having a driver primary winding a charge secondary winding, and a discharge secondary winding; said charge and discharge windings being magnetically coupled to said driver primary winding in mutual 180 degree opposition;
(b) said charge secondary winding and said discharge secondary winding being coupled respectively to said charging controlled power switch and said discharging controlled power switch;
(c) a driver oscillator operating at a selected frequency to conduct a driver signal of cyclically varying polarity through said driver primary winding; and
(d) said driver signal cyclically causing a trigger signal to flow through one of said charge or discharge secondary windings to a respective one of said charging or discharging controlled power switches to close circuit same while causing a nontrigger signal to flow through the other of said discharge or charge secondary windings to a respective other one of said discharging or charging controlled power switches to maintain same in an open circuit state.

10. A circuit as set forth in claim 6 wherein:
(a) said power switches are respectively a charging transistor and a discharging transistor, each having a respective collector-emitter path and a base element;
(b) a charging collector-emitter path of said charging transistor connects said one end of said series combination to said one power terminal;
(c) a discharging collector-emitter path of said discharging transistor is connected across said series combination; and
(d) a charging base of said charging transistor and a discharging base of said discharging transistor are connected to said trigger means.

11. A circuit as set forth in claim 6 including:
(a) a respective transistor switching accelerator means connecting each of said bases to said trigger means and is operative to accelerate the turn on and turn off of the associated transistor.

12. A circuit as set forth in claim 6 wherein said output transformer is a first output transformer including a first primary winding and a first secondary winding having a first load connected thereacross, and including:
(a) a second output transformer having a second primary winding connected in parallel with said first primary winding and having a second load connected to a second secondary winding of said second output transformer.

13. A circuit as set forth in claim 6 including:
(a) a gaseous discharge lamp connected to said secondary winding as a load.

14. A circuit as set forth in claim 6 wherein:
(a) said direct current power source is a voltage doubler power converter to convert alternating current to direct current at substantially double the peak voltage of said alternating current.

15. A power supply circuit for powering a gaseous discharge lamp and comprising:

(a) a direct current power source which is a voltage doubler power converter to convert alternating current to direct current at substantially double the peak voltage of said alternating current, said powerr source including a pair of opposite polarity power terminals;

(b) an output transformer having an output primary winding and an output secondary winding;

(c) a power storage capacitor connected in series with said output primary winding to form a series combination having a pair of opposite ends, one of said ends being connected to one of said power terminals;

(d) a charging power switch transistor having a charging collector-emitter path and a charging base, said a charging collector-emitter path connecting another of said ends of said series combination to another of said power terminals;

(e) a discharging power switch transistor having a discharging collector-emitter path and a discharging base, said discharging collector-emitter path being connected across said series combination;

(f) a driver transformer having a driver primary winding and having driver secondary winding means coupled to said charging base and said discharging base; and (g) a driver oscillator coupled to said driver primary winding and operating independently of said series combination at a selected frequency to cause a driver signal to flow through said driver primary winding and a trigger signal to flow through said driver secondary means to alternately activate one of said transistors to conduct and to substantially simultaneously deactivate the other of said transistors to cut off to thereby cause charging current to flow through said output primary winding to said capacitor from said power source when said charging transistor is conducting and to cause discharging current to flow through said output primary winding from said capacitor when said discharging transistor is conducting.

16. A circuit as set forth in claim 15 wherein:
(a) said driver transformer includes said driver primary winding, a charge secondary winding, and a discharge secondary winding; said charge and discharge windings being magnetically coupled to said driver primary winding in mutual 180 degree opposition;
(b) said charge secondary winding and said discharge secondary winding are coupled respectively to said charging base and said discharging base;
(c) said driver oscillator causes the flow of a driver signal of cyclically varying polarity through said driver primary winding; and
(d) said driver signal cyclically causes said trigger signal to flow through one of said charge or discharge secondary windings to a respective one of said charging or discharging bases to cause conduction through the associated transistor while causing a nontrigger signal to flow through the other of said discharge or charge secondary windings to a respective other one of said discharging or charging bases to maintain the other transistor in a cut off condition.

17. A circuit as set forth in claim 15 including:
(a) a respective transistor switching accelerator means connecting each of said bases to said driver secondary winding means and operative to accelerate the turn on and turn off of the associated transistor.

18. A circuit as set forth in claim 16 wherein said output transformer is a first output transformer including a first output primary winding and a first output secondary winding having a first load connected thereacross, and including:
(a) a second output transformer having a second output primary winding connected in parallel with said first output primary winding and having a second load connected to a second output secondary winding of said second output transformer.

* * * * *